(12) United States Patent
Khlat

(10) Patent No.: US 11,323,075 B2
(45) Date of Patent: May 3, 2022

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: QORVO US, INC., Greensboro, NC (US)

(*) Notice: Subject to any disclaimer, the term of this patent is extended or adjusted under 35 U.S.C. 154(b) by 130 days.

(21) Appl. No.: 16/669,728

(22) Filed: Oct. 31, 2019

(65) Prior Publication Data

US 2020/0382074 A1    Dec. 3, 2020

Related U.S. Application Data

(60) Provisional application No. 62/854,558, filed on May 30, 2019, provisional application No. 62/854,535, filed on May 30, 2019.

(51) Int. Cl.
*H03F 1/02* (2006.01)
*H03F 1/32* (2006.01)
(Continued)

(52) U.S. Cl.
CPC .............. *H03F 1/32* (2013.01); *H03F 1/0222* (2013.01); *H03F 3/19* (2013.01);
(Continued)

(58) Field of Classification Search
CPC ........ H03F 1/32; H03F 3/19; H03F 2200/451; H03F 2200/102; H03F 3/68; H03F 3/195; H03F 3/245; H03F 1/0227; H04B 1/16
(Continued)

(56) References Cited

U.S. PATENT DOCUMENTS 6,529,716 B1    3/2003 Eidson et al.
6,788,151 B2    9/2004 Shvarts et al.
(Continued)

FOREIGN PATENT DOCUMENTS

WO    2018182778 A1    10/2018

OTHER PUBLICATIONS

Non-Final Office Action for U.S. Appl. No. 16/263,368, dated Dec. 26, 2019, 6 pages.
(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

An envelope tracking (ET) amplifier apparatus is provided. The ET amplifier apparatus includes a distributed ET integrated circuit (DETIC) configured to generate a distributed ET voltage. The DETIC may be coupled to a higher-bandwidth (HB) amplifier circuit and a lower-bandwidth (LB) amplifier circuit configured to amplify an HB radio frequency (RF) signal and an LB RF signal, respectively. In examples discussed herein, the DETIC may be configured to selectively provide the ET voltage to one of the HB amplifier circuit and the LB amplifier circuit, depending on which of the HB amplifier circuit and the LB amplifier circuit is activated. By providing the DETIC in proximity to the HB amplifier circuit and the LB amplifier circuit, it may be possible to reduce potential distortion to the HB RF signal and the LB RF signal, without significantly increasing footprint of the ET amplifier apparatus.

19 Claims, 2 Drawing Sheets

Figure 1:
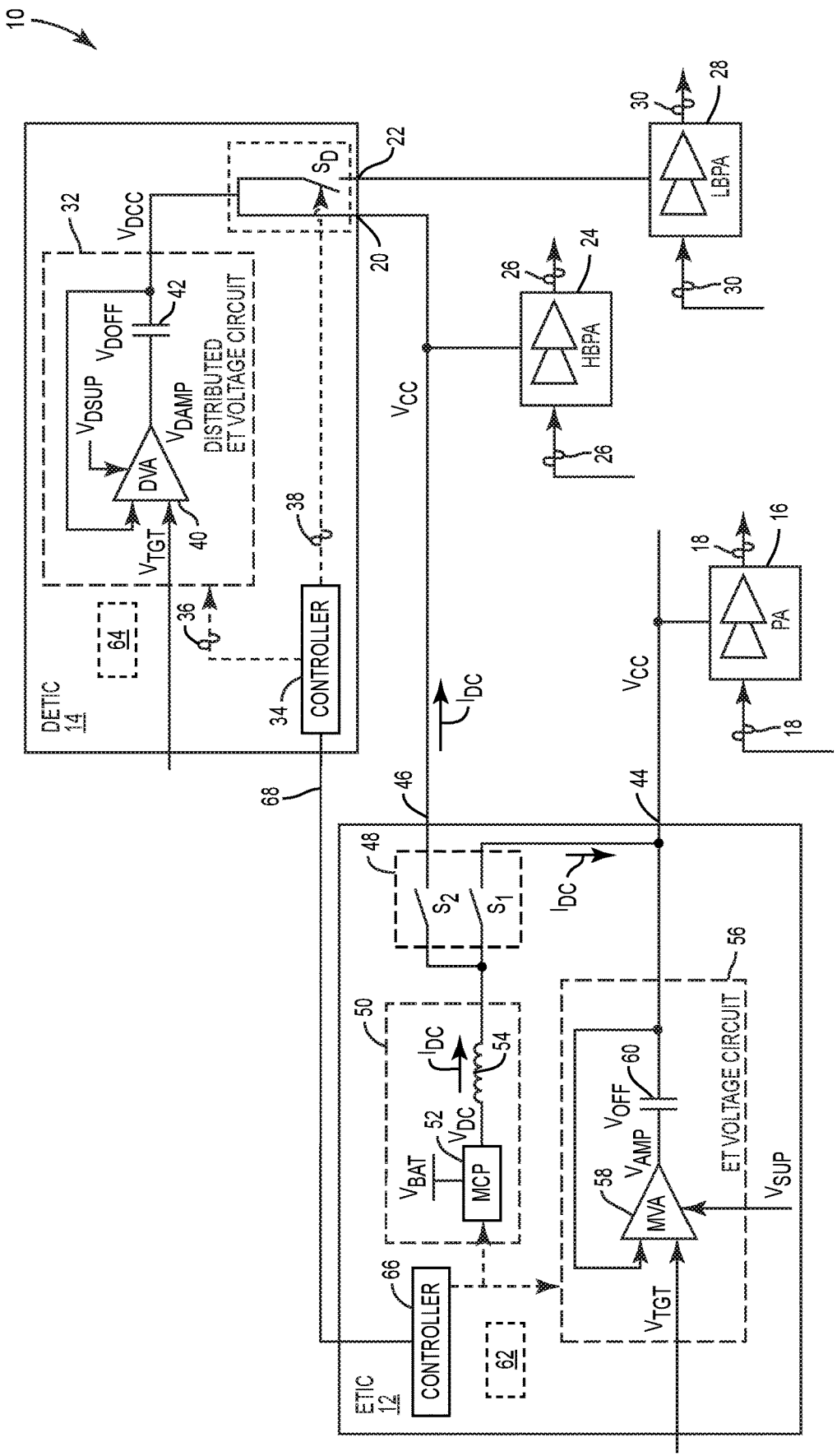

(51) Int. Cl.
*H03F 3/19* (2006.01)
*H04B 1/16* (2006.01)

(52) U.S. Cl.
CPC .. *H03F 2200/102* (2013.01); *H03F 2200/451* (2013.01); *H04B 1/16* (2013.01)

(58) Field of Classification Search
USPC ........................................ 330/136, 296, 297
See application file for complete search history.

(56) References Cited

U.S. PATENT DOCUMENTS

| | | | |
|---|---|---|---|
| 8,019,289 B2 | 9/2011 | Gorbachov | |
| 8,290,453 B2 | 10/2012 | Yoshihara | |
| 8,385,859 B2 | 2/2013 | Hamano | |
| 8,476,976 B2 | 7/2013 | Wimpenny | |
| 8,598,950 B2 | 12/2013 | Khesbak | |
| 8,600,321 B2 | 12/2013 | Nambu et al. | |
| 8,611,402 B2 | 12/2013 | Chiron | |
| 8,665,016 B2 | 3/2014 | Chowdhury et al. | |
| 8,665,931 B2 | 3/2014 | Afsahi et al. | |
| 8,803,603 B2 | 8/2014 | Wimpenny | |
| 8,816,272 B1 | 8/2014 | Brown et al. | |
| 8,816,768 B2 | 8/2014 | Tseng et al. | |
| 8,818,305 B1 | 8/2014 | Schwent et al. | |
| 8,921,774 B1 | 12/2014 | Brown et al. | |
| 8,942,651 B2 | 1/2015 | Jones | |
| 8,989,682 B2 | 3/2015 | Ripley et al. | |
| 9,002,303 B2 | 4/2015 | Brobston | |
| 9,065,509 B1 | 6/2015 | Yan et al. | |
| 9,197,162 B2 | 11/2015 | Chiron et al. | |
| 9,197,256 B2 | 11/2015 | Khlat | |
| 9,246,460 B2 | 1/2016 | Khlat et al. | |
| 9,247,496 B2 | 1/2016 | Khlat | |
| 9,270,230 B2 | 2/2016 | Henshaw et al. | |
| 9,287,829 B2 | 3/2016 | Nobbe et al. | |
| 9,288,098 B2 | 3/2016 | Yan et al. | |
| 9,294,043 B2 | 3/2016 | Ripley et al. | |
| 9,374,005 B2 | 6/2016 | Rozek et al. | |
| 9,379,667 B2 | 6/2016 | Khlat et al. | |
| 9,438,172 B2 | 9/2016 | Cohen | |
| 9,515,621 B2 | 12/2016 | Hietala et al. | |
| 9,515,622 B2 | 12/2016 | Nentwig et al. | |
| 9,516,693 B2 | 12/2016 | Khlat et al. | |
| 9,571,152 B2 | 2/2017 | Ripley et al. | |
| 9,596,110 B2 | 3/2017 | Jiang et al. | |
| 9,614,476 B2 | 4/2017 | Khlat | |
| 9,614,477 B1 * | 4/2017 | Rozenblit | H03F 3/245 |
| 9,641,206 B2 | 5/2017 | Pratt et al. | |
| 9,671,801 B2 | 6/2017 | Bhattad et al. | |
| 9,743,357 B2 | 8/2017 | Tabe | |
| 9,831,834 B2 | 11/2017 | Balteanu et al. | |
| 9,831,934 B2 | 11/2017 | Kotecha et al. | |
| 9,843,294 B2 | 12/2017 | Khlat | |
| 9,859,845 B2 | 1/2018 | Sarbishaei et al. | |
| 9,912,296 B1 | 3/2018 | Cheng et al. | |
| 9,912,297 B2 | 3/2018 | Khlat | |
| 9,912,301 B2 | 3/2018 | Xue et al. | |
| 9,941,844 B2 | 4/2018 | Khlat | |
| 9,948,240 B2 | 4/2018 | Khlat et al. | |
| 9,954,436 B2 | 4/2018 | Khlat | |
| 9,960,737 B1 | 5/2018 | Kovac | |
| 9,974,050 B2 | 5/2018 | Wiser et al. | |
| 9,991,851 B1 | 6/2018 | Dinur et al. | |
| 9,991,856 B2 | 6/2018 | Khesbak et al. | |
| 9,991,913 B1 | 6/2018 | Dinur et al. | |
| 10,003,303 B2 | 6/2018 | Afsahi et al. | |
| 10,069,470 B2 | 9/2018 | Khlat et al. | |
| 10,090,809 B1 | 10/2018 | Khlat | |
| 10,097,387 B1 | 10/2018 | Wiser et al. | |
| 10,103,926 B1 | 10/2018 | Khlat | |
| 10,110,169 B2 | 10/2018 | Khesbak et al. | |
| 10,141,891 B2 | 11/2018 | Gomez et al. | |
| 10,158,330 B1 | 12/2018 | Khlat | |
| 10,171,037 B2 | 1/2019 | Khlat | |
| 10,171,038 B1 | 1/2019 | Chen et al. | |
| 10,181,826 B2 | 1/2019 | Khlat et al. | |
| 10,204,775 B2 | 2/2019 | Brown et al. | |
| 10,305,429 B2 | 5/2019 | Choo et al. | |
| 10,326,408 B2 | 6/2019 | Khlat et al. | |
| 10,355,646 B2 | 7/2019 | Lee et al. | |
| 10,361,660 B2 | 7/2019 | Khlat | |
| 10,382,147 B2 | 8/2019 | Ripley et al. | |
| 10,396,716 B2 | 8/2019 | Afsahi et al. | |
| 10,419,255 B2 | 9/2019 | Wiser et al. | |
| 10,432,145 B2 | 10/2019 | Khlat | |
| 10,439,557 B2 | 10/2019 | Khlat et al. | |
| 10,439,789 B2 | 10/2019 | Brunel et al. | |
| 10,454,428 B2 | 10/2019 | Khesbak et al. | |
| 10,476,437 B2 | 11/2019 | Nag et al. | |
| 2004/0100323 A1 | 5/2004 | Khanifer et al. | |
| 2009/0128236 A1 | 5/2009 | Wilson | |
| 2009/0253389 A1 | 10/2009 | Ma et al. | |
| 2011/0223875 A1 | 9/2011 | Hamano | |
| 2012/0142304 A1 | 6/2012 | Degani et al. | |
| 2012/0146731 A1 | 6/2012 | Khesbak | |
| 2012/0194274 A1 | 8/2012 | Fowers et al. | |
| 2012/0302179 A1 | 11/2012 | Brobston | |
| 2012/0309333 A1 | 12/2012 | Nambu et al. | |
| 2013/0141159 A1 | 6/2013 | Strange et al. | |
| 2013/0207731 A1 | 8/2013 | Balteanu | |
| 2013/0285750 A1 | 10/2013 | Chowdhury et al. | |
| 2014/0111279 A1 | 4/2014 | Brobston | |
| 2014/0218109 A1 | 8/2014 | Wimpenny | |
| 2014/0306763 A1 | 10/2014 | Hong et al. | |
| 2014/0306769 A1 | 10/2014 | Khlat et al. | |
| 2014/0361837 A1 | 12/2014 | Strange et al. | |
| 2015/0009980 A1 | 1/2015 | Modi et al. | |
| 2015/0091645 A1 | 4/2015 | Park et al. | |
| 2015/0123628 A1 | 5/2015 | Bhattad et al. | |
| 2015/0194988 A1 | 7/2015 | Yan et al. | |
| 2015/0236729 A1 | 8/2015 | Peng et al. | |
| 2016/0036389 A1 | 2/2016 | Balteanu et al. | |
| 2016/0050629 A1 | 2/2016 | Khesbak et al. | |
| 2016/0094185 A1 | 3/2016 | Shute | |
| 2016/0094186 A1 | 3/2016 | Cohen | |
| 2016/0099686 A1 | 4/2016 | Perreault et al. | |
| 2016/0105151 A1 | 4/2016 | Langer | |
| 2016/0181995 A1 | 6/2016 | Nentwig et al. | |
| 2016/0204809 A1 | 7/2016 | Pratt et al. | |
| 2016/0226448 A1 | 8/2016 | Wimpenny | |
| 2016/0294587 A1 | 10/2016 | Jiang et al. | |
| 2017/0070199 A1 | 3/2017 | Anderson et al. | |
| 2017/0077877 A1 | 3/2017 | Anderson | |
| 2017/0093340 A1 | 3/2017 | Khesbak | |
| 2017/0207802 A1 | 7/2017 | Pratt et al. | |
| 2017/0230924 A1 | 8/2017 | Wolberg et al. | |
| 2017/0279412 A1 | 9/2017 | Afsahi et al. | |
| 2017/0353287 A1 | 12/2017 | Onaka et al. | |
| 2018/0048276 A1 | 2/2018 | Khlat et al. | |
| 2018/0138862 A1 | 5/2018 | Balteanu et al. | |
| 2018/0138863 A1 | 5/2018 | Khlat | |
| 2018/0159476 A1 | 6/2018 | Balteanu et al. | |
| 2018/0159566 A1 | 6/2018 | Dinur et al. | |
| 2018/0287564 A1 | 10/2018 | Afsahi et al. | |
| 2018/0309409 A1 | 10/2018 | Khlat | |
| 2018/0309414 A1 | 10/2018 | Khlat et al. | |
| 2018/0316440 A1 | 11/2018 | Mita | |
| 2018/0358930 A1 | 12/2018 | Haine | |
| 2019/0036493 A1 | 1/2019 | Khlat et al. | |
| 2019/0044480 A1 | 2/2019 | Khlat | |
| 2019/0089310 A1 | 3/2019 | Khlat et al. | |
| 2019/0109566 A1 | 4/2019 | Folkmann et al. | |
| 2019/0109613 A1 | 4/2019 | Khlat et al. | |
| 2019/0181804 A1 | 6/2019 | Khlat | |
| 2019/0222176 A1 | 7/2019 | Khlat | |
| 2019/0222181 A1 | 7/2019 | Khlat | |
| 2019/0267947 A1 | 8/2019 | Khlat et al. | |
| 2019/0356285 A1 | 11/2019 | Khlat et al. | |

(56) References Cited

U.S. PATENT DOCUMENTS

2020/0136575 A1    4/2020    Khlat et al.
2020/0350878 A1    11/2020   Drogi et al.

OTHER PUBLICATIONS

Notice of Allowance for U.S. Appl. No. 16/273,288, dated Dec. 13, 2019, 8 pages.
Non-Final Office Action for U.S. Appl. No. 16/263,316, dated Dec. 23, 2019, 9 pages.
Notice of Allowance for U.S. Appl. No. 16/267,740, dated Mar. 3, 2021, 8 pages.
Notice of Allowance for U.S. Appl. No. 16/263,316, dated Mar. 30, 2021, 7 pages.
Quayle Action for U.S. Appl. No. 16/250,298, dated Feb. 3, 2021, 5 pages.
Notice of Allowance for U.S. Appl. No. 16/250,298, dated Apr. 15, 2021, 8 pages.
Non-Final Office Action for U.S. Appl. No. 16/689,236, dated Mar. 2, 2021, 15 pages.
Notice of Allowance for U.S. Appl. No. 16/263,368, dated Apr. 29, 2021, 7 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,704, dated Dec. 30, 2020, 7 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.
Notice of Allowance for U.S. Appl. No. 16/193,513, dated Mar. 25, 2020, 8 pages.
Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Final Office Action for U.S. Appl. No. 16/263,316, dated May 13, 2020, 10 pages.
Notice of Allowance for U.S. Appl. No. 16/270,119, dated Jun. 18, 2020, 9 pages.
Non-Final Office Action for U.S. Appl. No. 16/278,886, dated Apr. 29, 2020, 9 pages.
Quayle Action for U.S. Appl. No. 16/267,779, dated May 1, 2020, 8 pages.
Final Office Action for U.S. Appl. No. 16/263,368, dated May 22, 2020, 9 pages.
U.S. Appl. No. 16/193,513, filed Nov. 16, 2018.
U.S. Appl. No. 16/250,229, filed Jan. 17, 2019.
U.S. Appl. No. 16/267,740, filed Feb. 5, 2019.
U.S. Appl. No. 16/263,316, filed Jan. 31, 2019.
U.S. Appl. No. 16/270,119, filed Feb. 7, 2019.
U.S. Appl. No. 16/273,288, filed Feb. 12, 2019.
U.S. Appl. No. 16/278,886, filed Feb. 19, 2019.
U.S. Appl. No. 16/250,298, filed Jan. 17, 2019.
U.S. Appl. No. 16/267,779, filed Feb. 5, 2019.
U.S. Appl. No. 16/263,368, filed Jan. 31, 2019.
U.S. Appl. No. 16/508,704, filed Jul. 11, 2019.
U.S. Appl. No. 16/508,768, filed Jul. 17, 2019.
U.S. Appl. No. 16/514,339, filed Jul. 17, 2019.
U.S. Appl. No. 16/660,900, filed Oct. 23, 2019.
Notice of Allowance for U.S. Appl. No. 16/250,229, dated Sep. 22, 2020, 7 pages.
Non-Final Office Action for U.S. Appl. No. 16/263,316, dated Jul. 17, 2020, 4 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Non-Final Office Action for U.S. Appl. No. 17/027,963, dated Aug. 13, 2021, 6 pages.
Notice of Allowance for U.S. Appl. No. 16/689,236, dated Jun. 9, 2021, 7 pages.
Notice of Allowance and Examiner-Initiated Interview Summary for U.S. Appl. No. 16/669,728, dated Dec. 8, 2021, 8 pages.

* cited by examiner

ENVELOPE TRACKING AMPLIFIER APPARATUS

RELATED APPLICATIONS

This application claims the benefit of provisional patent application Ser. No. 62/854,558, filed May 30, 2019, and provisional patent application Ser. No. 62/854,535, filed May 30, 2019, the disclosures of which are hereby incorporated herein by reference in their entireties.

FIELD OF THE DISCLOSURE

The technology of the disclosure relates generally to an envelope tracking (ET) power amplifier apparatus.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance to time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, the time-variant ET voltage(s) can be highly susceptible to distortions caused by trace inductance, particularly when the time-variant ET voltage(s) is so generated to track the time-variant power envelope(s) of a high modulation bandwidth (e.g., >200 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it may be necessary to ensure that the ET power amplifier(s) can consistently operate at a desired linearity for any given instantaneous power requirement of the RF signal(s).

SUMMARY

Embodiments of the disclosure relate to an envelope tracking (ET) amplifier apparatus. The ET amplifier apparatus includes a distributed ET integrated circuit (DETIC) configured to generate a distributed ET voltage. The DETIC may be coupled to a higher-bandwidth (HB) amplifier circuit and a lower-bandwidth (LB) amplifier circuit configured to amplify an HB radio frequency (RF) signal and an LB RF signal, respectively. In examples discussed herein, the DETIC may be configured to selectively provide the ET voltage to one of the HB amplifier circuit and the LB amplifier circuit, depending on which of the HB amplifier circuit and the LB amplifier circuit is activated. By providing the DETIC in proximity to the HB amplifier circuit and the LB amplifier circuit, it may be possible to reduce potential distortion to the HB RF signal and the LB RF signal, without significantly increasing a footprint of the ET amplifier apparatus.

In one aspect, an ET amplifier apparatus is provided. The ET amplifier apparatus includes an ET integrated circuit (ETIC) configured to generate and provide an ET voltage to an amplifier circuit for amplifying an RF signal. The ET amplifier apparatus also includes a DETIC. The DETIC includes an HB output coupled to a HB amplifier circuit configured to amplify an HB RF signal. The DETIC also includes an LB output coupled to an LB amplifier circuit configured to amplify an LB RF signal. The DETIC also includes a distributed ET voltage circuit coupled to the HB output and the LB output. The distributed ET voltage circuit is configured to generate a distributed ET voltage. The DETIC also includes a distributed controller configured to cause the distributed ET voltage circuit to provide the distributed ET voltage to at least one of the HB output and the LB output.

In another aspect, an ET amplifier apparatus is provided. The ET amplifier apparatus includes an ETIC. The ETIC includes an ET voltage circuit configured to generate based on an ET target voltage and provide the ET voltage to an amplifier circuit for amplifying an RF signal. The ETIC also includes a target voltage circuit configured to receive and provide the ET target voltage to the ET voltage circuit. The ET amplifier apparatus also includes a DETIC. The DETIC includes an HB output coupled to an HB amplifier circuit configured to amplify an HB RF signal. The DETIC also includes an LB output coupled to an LB amplifier circuit configured to amplify an LB RF signal. The DETIC also includes a distributed ET voltage circuit coupled to the HB output and the LB output. The distributed ET voltage circuit is configured to receive the ET target voltage from the target voltage circuit. The distributed ET voltage circuit is also configured to generate a distributed ET voltage based on the ET target voltage. The DETIC also includes a distributed controller configured to cause the distributed ET voltage circuit to provide the distributed ET voltage to at least one of the HB output and the LB output.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
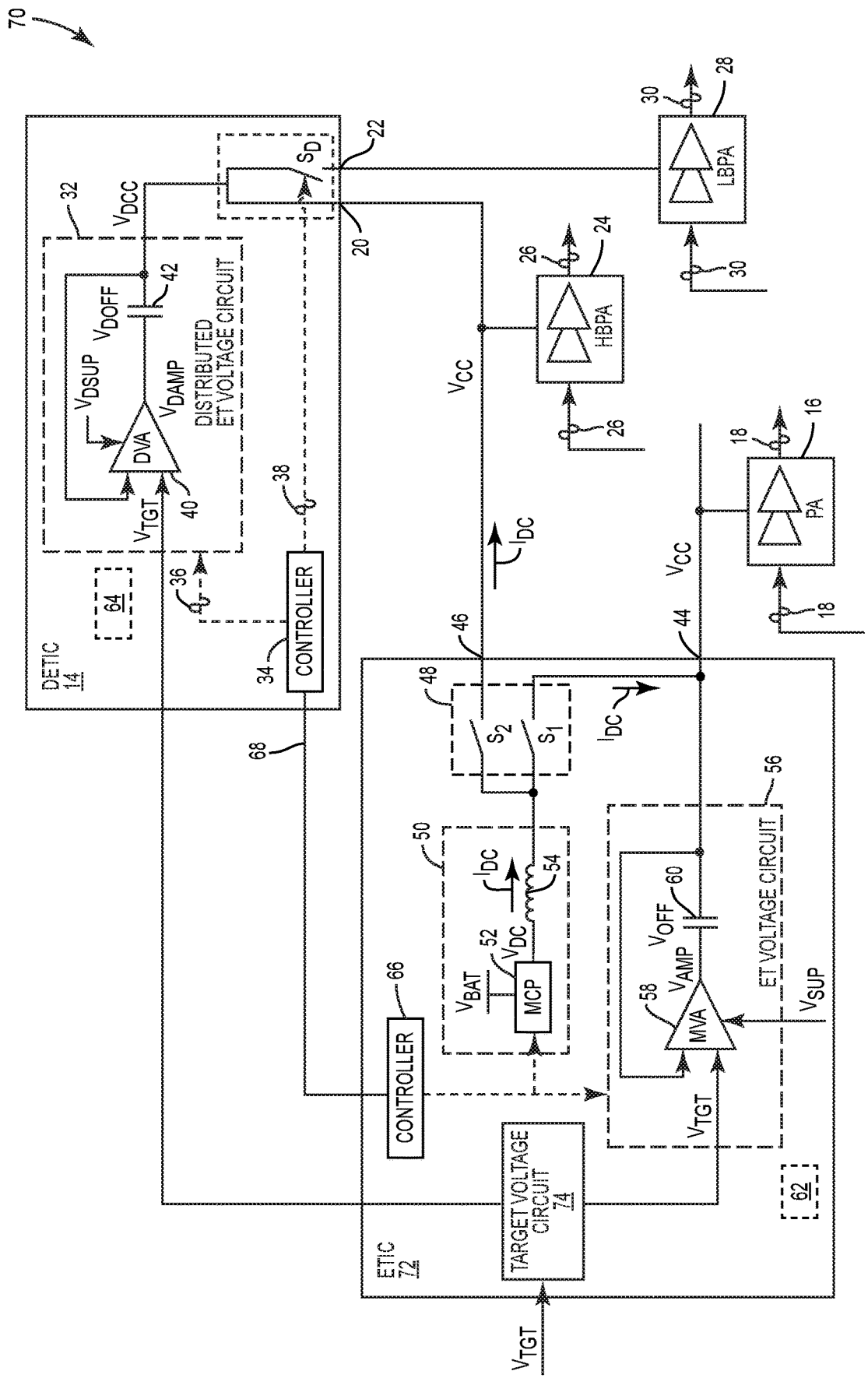

FIG. 1 is a schematic diagram of an exemplary envelope tracking (ET) amplifier apparatus configured according to an embodiment of the present disclosure; and FIG. 2 is a schematic diagram of an exemplary ET amplifier apparatus configured according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) amplifier apparatus. The ET amplifier apparatus includes a distributed ET integrated circuit (DETIC) configured to generate a distributed ET voltage. The DETIC may be coupled to a higher-bandwidth (HB) amplifier circuit and a lower-bandwidth (LB) amplifier circuit configured to amplify an HB radio frequency (RF) signal and an LB RF signal, respectively. In examples discussed herein, the DETIC may be configured to selectively provide the ET voltage to one of the HB amplifier circuit and the LB amplifier circuit, depending on which of the HB amplifier circuit and the LB amplifier circuit is activated. By providing the DETIC in proximity to the HB amplifier circuit and the LB amplifier circuit, it may be possible to reduce potential distortion to the HB RF signal and the LB RF signal, without significantly increasing a footprint of the ET amplifier apparatus.

In this regard, FIG. 1 is a schematic diagram of an exemplary ET amplifier apparatus 10 configured according to an embodiment of the present disclosure. The ET amplifier apparatus 10 includes an ET integrated circuit (ETIC) 12 and a DETIC 14. The ETIC 12 is configured to generate and provide an ET voltage $V_{CC}$ to an amplifier circuit 16 for amplifying an RF signal 18. Notably, the amplifier circuit 16 may be included as part of the ET amplifier apparatus 10.

The DETIC 14 includes an HB output 20 and an LB output 22. The HB output 20 is coupled to an HB amplifier circuit 24 (denoted as "HBPA") configured to amplify an HB RF signal 26. The LB output 22 is coupled to an LB amplifier circuit 28 (denoted as "LBPA") configured to amplify an LB RF signal 30. Notably, the HB amplifier circuit 24 and/or the LB amplifier circuit 28 may be provided as part of the ET amplifier apparatus 10. In a non-limiting example, the HB RF signal 26 is modulated in a higher modulation bandwidth greater than 200 MHz. In contrast, the LB RF signal 30 is modulated in a lower modulation bandwidth lower than or equal to 200 MHz.

The DETIC 14 includes a distributed ET voltage circuit 32 configured to generate a distributed ET voltage $V_{DCC}$ based on an ET target voltage $V_{TGT}$ and a distributed supply voltage $V_{DSUP}$. In examples discussed herein, the distributed ET voltage circuit 32 is coupled to the HB output 20 directly, and coupled to the LB output 22 via a distributed switch $S_D$. In this regard, the distributed ET voltage circuit 32 always provides the distributed ET voltage $V_{DCC}$ to the HB output 20. However, the distributed ET voltage circuit 32 will only provide the distributed ET voltage $V_{DCC}$ to the LB output 22 when the distributed switch $S_D$ is closed.

The DETIC 14 further includes a distributed controller 34, which can be implemented by a microprocessor, a microcontroller, or a field-programmable gate array (FPGA), as an example. The distributed controller 34 may be configured to control to the distributed ET voltage circuit 32 and the distributed switch $S_D$ via a first control signal 36 and a second control signal 38, respectively.

In a non-limiting example, only one of the HB amplifier circuit 24 and the LB amplifier circuit 28 can be activated at a given time. In this regard, when the HB amplifier circuit 24 is activated to amplify the HB RF signal 26, the distributed controller 34 can be configured to open the distributed switch $S_D$ to decouple the distributed ET voltage circuit 32 from the LB output 22. As a result of opening the distributed switch $S_D$, the LB amplifier circuit 28 cannot receive the distributed ET voltage $V_{DCC}$ and thus cannot amplify the LB RF signal 30 regardless of whether the LB amplifier circuit 28 is activated. In addition, by opening the distributed switch $S_D$ while the HB amplifier circuit 24 is activated, the LB amplifier circuit 28 is isolated from the DETIC 14. As such, it may be possible to isolate an inherent capacitive impedance of the LB amplifier circuit 28 from the HB amplifier circuit 24.

In contrast, when the LB amplifier circuit 28 is activated to amplify the LB RF signal 30, the distributed controller 34 will need to deactivate the HB amplifier circuit 24. Accordingly, the distributed controller 34 can close the distributed switch $S_D$ such that the LB amplifier circuit 28 can be coupled to the distributed ET voltage circuit 32 to receive the distributed ET voltage $V_{DCC}$. Notably, as a result of deactivating the HB amplifier circuit 24, it may be possible to isolate the inherent capacitive impedance of the HB amplifier circuit 24 from the LB amplifier circuit 28.

In a non-limiting example, the DETIC 14 is provided in proximity to at least one of the HB amplifier circuit 24 and the LB amplifier circuit 28. Notably, the DETIC 14 is said to be in proximity to the HB amplifier circuit 24 and/or the LB amplifier circuit 28 if a corresponding trace inductance between the DETIC 14 and the HB amplifier circuit 24 and/or the LB amplifier circuit 28 can be limited to below seven-tenths nanoHenry (<0.7 nH). By providing the DETIC 14 in proximity to the HB amplifier circuit 24 and/or the LB amplifier circuit 28, it may be possible to reduce distortion in the distributed ET voltage $V_{DCC}$, thus helping to prevent a potential distortion(s) (e.g., amplitude clipping) in the HB RF signal 26 and/or the LB RF signal 30.

The distributed ET voltage circuit 32 can be configured to include a distributed voltage amplifier 40 (denoted as "DVA") and a distributed offset capacitor 42. The distributed voltage amplifier 40 is configured to generate an initial distributed ET voltage $V_{DAMP}$ based on an ET target voltage $V_{TGT}$ and a distributed supply voltage $V_{DSUP}$. The distributed offset capacitor 42 is configured to raise the initial distributed ET voltage $V_{DAMP}$ by a distributed offset voltage $V_{DOFF}$ to generate the distributed ET voltage $V_{DCC}$ ($V_{DCC}=V_{DAMP}+V_{DOFF}$).

The ETIC 12 can be configured to include a primary output 44 and an auxiliary output 46. In a non-limiting example, the primary output 44 is coupled to the amplifier circuit 16 to provide the ET voltage $V_{CC}$ to the amplifier circuit 16 for amplifying the RF signal 18. The auxiliary output 46 may be coupled to the HB amplifier circuit 24 and the distributed switch $S_D$. The ETIC 12 may include a switch circuit 48. The switch circuit 48 includes a first switch $S_1$ and a second switch $S_2$ coupled to the primary output 44 and the auxiliary output 46, respectively.

The ETIC 12 includes a tracker circuit 50. In a non-limiting example, the tracker circuit 50 includes a multi-level charge pump (MCP) 52 and a power inductor 54. The MCP 52 is configured to generate a low-frequency voltage $V_{DC}$ based on a battery voltage $V_{BAT}$. The MCP 52 can be configured to generate the low-frequency voltage $V_{DC}$ at multiple levels. For example, the low-frequency voltage $V_{DC}$ can be so generated to equal 0 volts (0 V), the battery voltage ($V_{BAT}$), or two-time of the battery voltage ($2\times V_{BAT}$). The power inductor 54 is configured to induce a low-frequency current $I_{DC}$ (e.g., a direct current) based on the low-frequency voltage $V_{DC}$.

The ETIC 12 also includes an ET voltage circuit 56. The ET voltage circuit 56 includes a voltage amplifier 58 and an offset capacitor 60. The voltage amplifier 58 is configured to generate an initial ET voltage $V_{AMP}$ based on the ET target voltage $V_{TGT}$ and a supply voltage $V_{SUP}$. The offset capacitor 60 is configured to raise the initial ET voltage $V_{AMP}$ by an offset voltage $V_{OFF}$ to generate the ET voltage $V_{CC}$ at the primary output 44 ($V_{CC}=V_{AMP}+V_{OFF}$). The voltage amplifier 58 and the distributed voltage amplifier 40 may be configured to receive the ET target voltage $V_{TGT}$ from a coupled transceiver circuit (not shown).

In a non-limiting example, the ETIC 12 includes a supply voltage circuit 62 configured to generate and provide the supply voltage $V_{SUP}$ and the distributed supply voltage $V_{DSUP}$ to the voltage amplifier 58 and the distributed voltage amplifier 40, respectively. It should be appreciated that it may also be possible to configure the supply voltage circuit 62 to only generate the supply voltage $V_{SUP}$ and employ a distributed supply voltage circuit 64 in the DETIC 14 to generate the distributed supply voltage $V_{DSUP}$. The supply voltage circuit 62 and/or the distributed supply voltage circuit 64 may be configured to generate the supply voltage $V_{SUP}$ and/or the distributed supply voltage $V_{DSUP}$ at different voltage levels.

The ETIC 12 can be configured to include an ETIC controller 66, which can be implemented by a microprocessor, a microcontroller, or an FPGA, as an example. When the amplifier circuit 16 is activated to amplify the RF signal 18, the ETIC controller 66 may close the first switch $S_1$ and open the second switch $S_2$ such that the amplifier circuit 16 can receive the low-frequency current $I_{DC}$ via the primary output 44. In contrast, when the amplifier circuit 16 is deactivated, the ETIC controller 66 may open the first switch $S_1$ and close the second switch $S_2$ to provide the low-frequency current $I_{DC}$ to the auxiliary output 46. In addition, when the amplifier circuit 16 is deactivated, the ETIC controller 66 may further deactivate the voltage amplifier 58 to help reduce power consumption and heat dissipation in the ETIC 12.

By closing the second switch S2, the low-frequency current $I_{DC}$ flows from the auxiliary output 46 toward the HB amplifier circuit 24 and the distributed switch $S_D$. In this regard, if the distributed controller 34 opens the distributed switch $S_D$, then the low-frequency current $I_{DC}$ would flow exclusively toward the HB amplifier circuit 24. In contrast, if the distributed controller 34 closes the distributed switch $S_D$ and deactivates the HB amplifier circuit 24, the low-frequency current $I_{DC}$ would instead flow toward the LB amplifier circuit 28 via the distributed switch $S_D$.

The ETIC controller 66 may communicate with the distributed controller 34 via a communication bus 68 to coordinate operations in the ETIC 12 and the DETIC 14. For example, the ETIC controller 66 can notify the distributed controller 34 when the second switch $S_2$ is closed such that the distributed controller 34 can open or close the distributed switch $S_D$ accordingly. In a non-limiting example, the communication bus 68 can be an RF front-end (RFFE) bus as defined by the MIPI® Alliance. In another non-limiting example, the communication bus 68 can be a single-wire peer-to-peer bus.

FIG. 2 is a schematic diagram of an exemplary ET amplifier apparatus 70 configured according to another embodiment of the present disclosure. Common elements between FIGS. 1 and 2 are shown therein with common element numbers and will not be re-described herein.

The ET amplifier apparatus 70 includes an ETIC 72. The ETIC 72 differs from the ETIC 12 in FIG. 2 in that the ETIC 72 further includes a target voltage circuit 74. In a non-limiting example, the target voltage circuit 74 is configured to receive the ET target voltage $V_{TGT}$ from a coupled transceiver circuit (not shown). Accordingly, the target voltage circuit 74 provides the received ET target voltage $V_{TGT}$ to the voltage amplifier 58 and the distributed voltage amplifier 40.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) amplifier apparatus comprising:
    an ET integrated circuit (ETIC) configured to generate and provide an ET voltage to an amplifier circuit for amplifying a radio frequency (RF) signal; and
    a distributed ETIC (DETIC) comprising:
        a higher-bandwidth (HB) output coupled to an HB amplifier circuit configured to amplify an HB RF signal;
        a lower-bandwidth (LB) output coupled to an LB amplifier circuit configured to amplify an LB RF signal;
        a distributed ET voltage circuit coupled to the HB output and the LB output, the distributed ET voltage circuit configured to generate a distributed ET voltage; and
        a distributed controller configured to:
            cause the distributed ET voltage circuit to provide the distributed ET voltage to the HB output in response to the HB amplifier circuit being activated and the LB amplifier circuit being deactivated; and
            cause the distributed ET voltage to provide the distributed ET voltage to the LB output in response to the HB amplifier circuit being deactivated and the LB amplifier circuit being activated.

2. The ET amplifier apparatus of claim 1 wherein:
    the HB RF signal is modulated in a higher modulation bandwidth greater than two-hundred megahertz; and
    the LB RF signal is modulated in a lower modulation bandwidth less than or equal to two-hundred megahertz.

3. The ET amplifier apparatus of claim 1 wherein the DETIC is provided in proximity to at least one of the HB amplifier circuit and the LB amplifier circuit.

4. The ET amplifier apparatus of claim 1 wherein the distributed ET voltage circuit is coupled to the LB output via a distributed switch.

5. The ET amplifier apparatus of claim 4 wherein the distributed controller is further configured to open the distributed switch to cause the distributed ET voltage to be provided exclusively to the HB output when the HB amplifier circuit is activated to amplify the HB RF signal.

6. The ET amplifier apparatus of claim 4 wherein the distributed controller is further configured to close the distributed switch to cause the distributed ET voltage to be provided to the LB output when the HB amplifier circuit is deactivated and the LB amplifier circuit is activated to amplify the LB RF signal.

7. The ET amplifier apparatus of claim 4 wherein the distributed ET voltage circuit further comprises:
    a distributed voltage amplifier configured to generate an initial distributed ET voltage based on an ET target voltage and a distributed supply voltage; and
    a distributed offset capacitor configured to raise the initial distributed ET voltage by a distributed offset voltage to generate the distributed ET voltage.

8. The ET amplifier apparatus of claim 7 wherein the DETIC further comprises a distributed supply voltage circuit configured to generate and provide the distributed supply voltage to the distributed voltage amplifier.

9. The ET amplifier apparatus of claim 7 wherein the ETIC comprises:
    a primary output coupled to the amplifier circuit;
    an auxiliary output coupled to the HB amplifier circuit and the distributed switch;
    a switch circuit comprising a first switch and a second switch coupled to the primary output and the auxiliary output, respectively;
    an ET voltage circuit comprising:
        a voltage amplifier configured to generate an initial ET voltage based on the ET target voltage and a supply voltage; and
        an offset capacitor configured to raise the initial ET voltage by an offset voltage to generate the ET voltage at the primary output; and
    a tracker circuit coupled to the switch circuit and configured to generate a low-frequency current at the primary output based on a battery voltage.

10. The ET amplifier apparatus of claim 9 wherein the ETIC further comprises a supply voltage circuit configured to generate and provide the supply voltage and the distributed supply voltage to the voltage amplifier and the distributed voltage amplifier, respectively.

11. The ET amplifier apparatus of claim 9 further comprising the amplifier circuit.

12. The ET amplifier apparatus of claim 9 wherein the ETIC further comprises an ETIC controller configured to:
    close the first switch and open the second switch when the amplifier circuit is activated; and
    open the first switch and close the second switch when the amplifier circuit is deactivated.

13. The ET amplifier apparatus of claim 12 wherein the ETIC controller is further configured to deactivate the voltage amplifier when the amplifier circuit is deactivated.

14. The ET amplifier apparatus of claim 12 wherein the distributed controller is further configured to open the distributed switch to cause the low-frequency current to be provided exclusively to the HB amplifier circuit when the HB amplifier circuit is activated.

15. The ET amplifier apparatus of claim 12 wherein the distributed controller is further configured to close the distributed switch to cause the low-frequency current to be provided to the LB amplifier circuit when the HB amplifier circuit is deactivated and the LB amplifier circuit is activated.

16. The ET amplifier apparatus of claim 12 wherein the ETIC controller is coupled to the distributed controller via an RF front-end (RFFE) bus.

17. The ET amplifier apparatus of claim 12 wherein the ETIC controller is coupled to the distributed controller via a single-wire peer-to-peer bus.

18. The ET amplifier apparatus of claim 9 wherein the ETIC further comprises a target voltage circuit configured to:

receive the ET target voltage from a coupled transceiver circuit; and provide the ET target voltage to the voltage amplifier and the distributed voltage amplifier.

19. An envelope tracking (ET) amplifier apparatus comprising:
- an ET integrated circuit (ETIC) comprising:
  - an ET voltage circuit configured to generate based on an ET target voltage and provide the ET target voltage to an amplifier circuit for amplifying a radio frequency (RF) signal; and
  - a target voltage circuit configured to receive and provide the ET target voltage to the ET voltage circuit; and
- a distributed ETIC (DETIC) comprising:
  - a higher-bandwidth (HB) output coupled to an HB amplifier circuit configured to amplify an HB RF signal;
  - a lower-bandwidth (LB) output coupled to an LB amplifier circuit configured to amplify an LB RF signal;
  - a distributed ET voltage circuit coupled to the HB output and the LB output, the distributed ET voltage circuit configured to:
    - receive the ET target voltage from the target voltage circuit; and
    - generate a distributed ET voltage based on the ET target voltage; and
  - a distributed controller configured to:
    - cause the distributed ET voltage circuit to provide the distributed ET voltage to the HB output in response to the HB amplifier circuit being activated and the LB amplifier circuit being deactivated; and
    - cause the distributed ET voltage to provide the distributed ET voltage to the LB output in response to the HB amplifier circuit being deactivated and the LB amplifier circuit being activated.

* * * * *